United States Patent [19]

Wenger

[11] Patent Number: 4,757,892
[45] Date of Patent: Jul. 19, 1988

[54] ALIGNING AND CENTERING DEVICES FOR ARMS OF FORK-SHAPED PLATE CARRIERS DURING LOADING AND UNLOADING OF PLATES

[75] Inventor: Hartmut Wenger, Pratteln, Switzerland

[73] Assignee: Ciba-Geigy Corporation, Ardsley, N.Y.

[21] Appl. No.: 67,525

[22] Filed: Jun. 29, 1987

[30] Foreign Application Priority Data

Jul. 8, 1986 [CH] Switzerland ............... 2752/86

[51] Int. Cl.⁴ ................................. B65G 17/12
[52] U.S. Cl. .......................... 198/404; 198/801
[58] Field of Search ............... 198/345, 404, 408, 801

[56] References Cited

U.S. PATENT DOCUMENTS

| | | | |
|---|---|---|---|
| 1,736,866 | 11/1929 | Wagner et al. | 198/801 X |
| 3,378,131 | 4/1968 | Weber | 198/134 |
| 3,795,301 | 3/1974 | Sugitani | 198/404 |
| 3,937,316 | 2/1976 | Gerhardt | 198/801 X |
| 4,058,908 | 11/1977 | Weber | 198/801 X |
| 4,067,433 | 1/1978 | Phipps | 198/404 X |
| 4,274,535 | 6/1981 | Haas, Sr. et al. | 198/801 X |
| 4,505,375 | 3/1985 | Kuster | 198/801 X |
| 4,645,400 | 2/1987 | Mally et al. | 198/404 X |

Primary Examiner—Robert J. Spar
Assistant Examiner—D. Glenn Dayoan
Attorney, Agent, or Firm—Harry Falber

[57] ABSTRACT

An alignment and centering device is associated with a carrier having two fork arms and a transverse base to which the rearward ends of the fork arms are attached and which is connected with a conveyor mechanism in a framework with a plate-loading station, and a plate-feeding device therein for advancing plates toward the free fork ends of the fork-shaped carrier in a plate-advancement plane. The alignment and centering device comprises rearward and forward engaging members on an outer wall of each fork arm, facing away from the other fork arm; aligning devices for engaging the rearward engaging members; and forward, centering aligning devices for engaging the forward engaging members on the fork arm after the rearward engaging members have been engaged by the first aligning devices. The alignment and centering device is stationary on the framework and the first and second aligning devices are displaceable therein parallel with the plate-advancement plane.

11 Claims, 9 Drawing Sheets

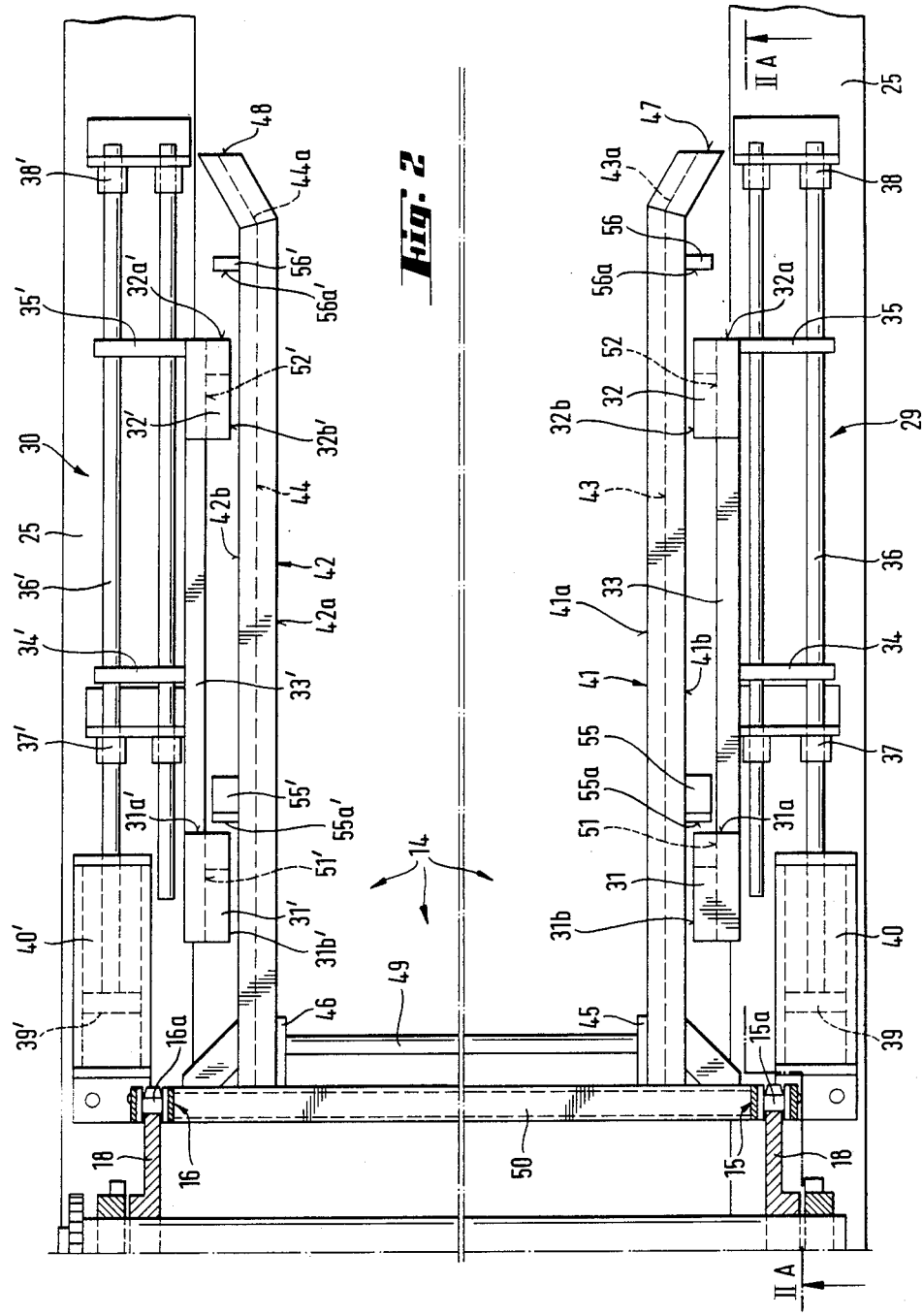

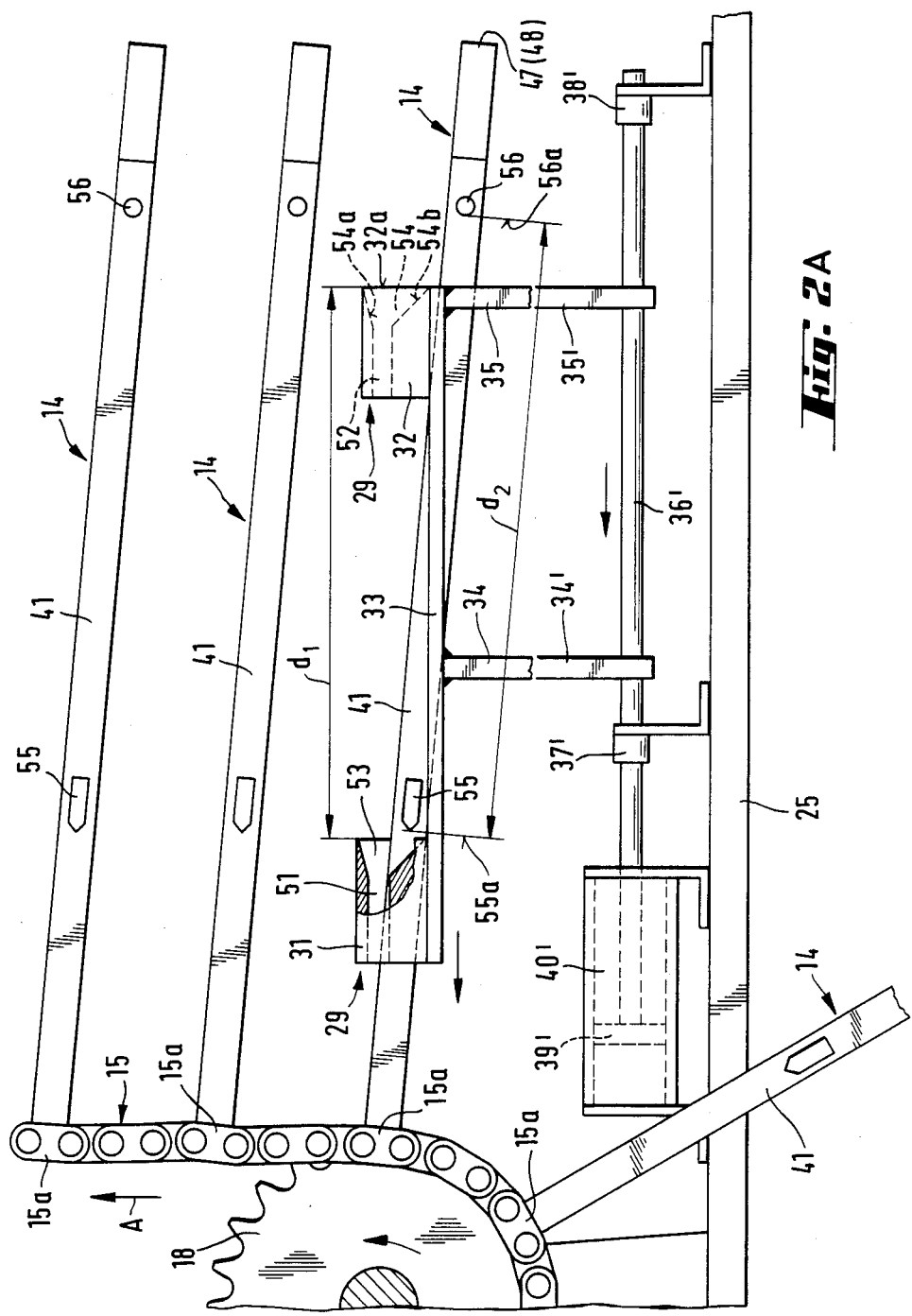

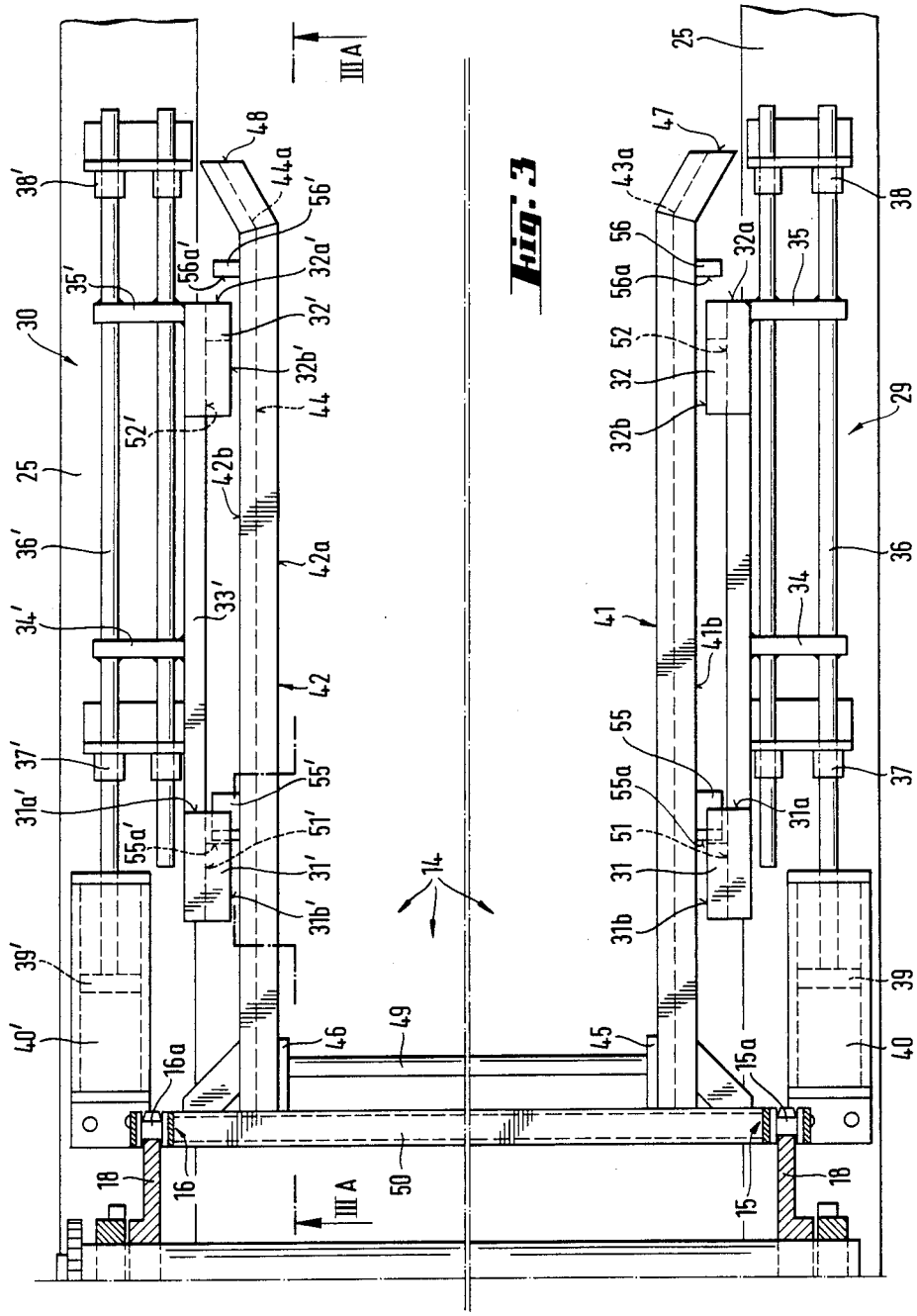

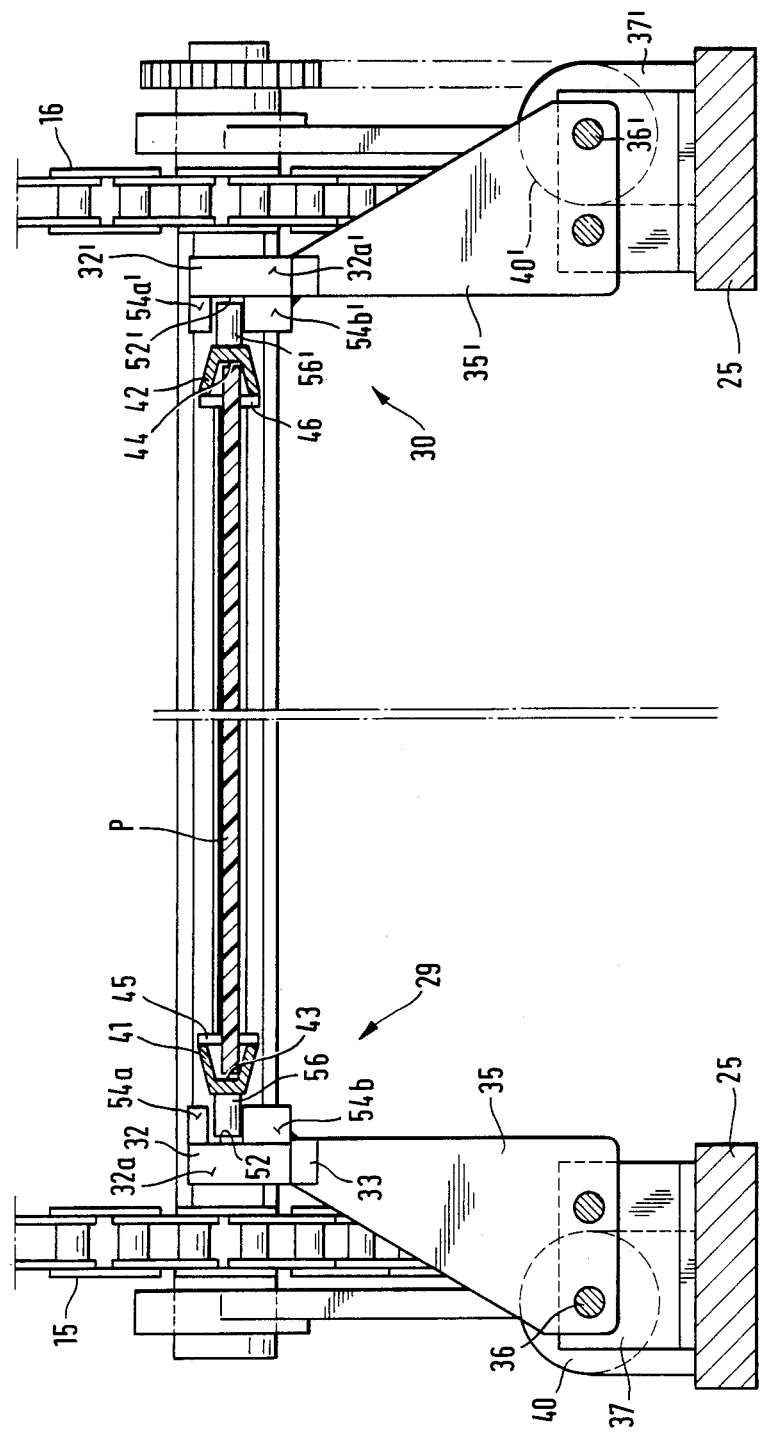

ALIGNING AND CENTERING DEVICES FOR ARMS OF FORK-SHAPED PLATE CARRIERS DURING LOADING AND UNLOADING OF PLATES

BACKGROUND OF THE INVENTION

This invention relates to aligning and centering means for the arms of fork-shaped plate-carriers during the loading and unloading of plates into and from the carriers.

In the production of printed plates and in particular of printed electric and electronic circuit boards, there is a rapidly growing demand for far-reaching automation of all manufacturing steps, in order to reduce production costs and remain competitive. It has, therefore, become necessary to make not only certain production steps fully automatic, but also the conveyance of goods between the various work stations is increasingly required to be fully automated.

Among the various known conveying systems, those using fork-shaped plate carriers of basically U-shaped configuration have found general acceptance. These carriers are mounted fixedly on a suitable, mostly upwardly and/or downwardly moving mechanism driven to move intermittently, with stationary intervals in between.

A forked plate carrier has its one end constituted by a cross bar attached to the moving mechanism, e.g. the chain links, being horizontally aligned, i.e., in a plane vertical to the conveying direction, of two conveyor chains and the other open end constituted by two parallel fork arms in essentially the same plane. The moving mechanism may comprise a single one or a plurality of such forked plate carriers.

In U.S. Pat. No. 1,736,866 of Charles Wagner et al, issued Nov. 26, 1929 there is described a drying apparatus for wet plates which comprises an elevating stretch, in the form of two conveyor chains running about top and bottom sprockets. Forked plate carriers of the above-described type are attached with their closed carrier ends to the conveyor chains.

Charging means are mounted on a framework at a determined level near the lower end of the ascending stretch next to the free fork ends of the passing plate carriers and are adapted for shifting a plate to be dried edgewise into supporting contact with a plate carrier which has stopped during its intermittent upward move at approximately the same level as the plate in the charging means.

This known apparatus comprises transfer means adjacent the top of the ascending stretch of the conveying mechanism, which transfer the plate horizontally from the ascending to an aligned plate carrier at the top of the descending stretch.

Plate removing means similar to the above-mentioned charging means are provided at the foot end of the descending stretch of the conveyor mechanism.

Similar apparatus are described in U.S. Pat. Nos. 3,378,131 and 4,058,908 of Erich Weber, granted Apr. 16, 1968 and Nov. 22, 1977, respectively.

In all of these known apparatuses, a plate being dried is shifted at the top of the straight stretches of the conveyor mechanism from an ascending to a descending stretch, whereby the plates pass through the descending stretch with the same plate face uppermost as in the ascending stretch. This is acceptable when only one face of the plate is partially coated or printed on. However, in particular in the manufacture of electronic circuit boards, but also in other fields of application, it is necessary to coat or print partially both faces of a plate or board, made of paper, card sheet, plastic film, timber, sheet metal or other material as may be required in the particular type of application.

In that case, it is desirable to have the plates turn with their respective carriers, e.g. about the sprockets at the top end of the ascending stretch so that, in the descending branch the dried top face of the plate having dried in the ascending stretch becomes the underside in the descending stretch. Having left the first drying station the former underside, now the top side of the plate can then be partially coated or printed on and pass through another apparatus of the above-described kind, whereupon the plate, dried on both faces, can be discharged from the second apparatus.

In the plant for manufacturing the last-described kind of plates, the latter must not be transferred substantially horizontally between the top ends of the straight ascending and descending stretches of the conveying mechanism but must turn once over as do the plate carriers anyway.

The above-described known apparatus would not be suited for doing so as the plates are deposited loosely on the forked plate carriers.

Therefore, plate carriers have been constructed the two fork arms of which have longitudinal grooves in those of their sidewalls, facing toward each other, which grooves open forward out of the free ends of the two fork arms; thereby a plate to be secured in the carrier can be inserted from the free ends of the two fork arms, which ends are slightly flared laterally outwardly in order to facilitate the introduction of the leading edge into the open ends of the two opposing grooves. The rims of the plate extending parallel with the two fork arms are thus held firmly in the grooves on the inner sidewalls of the two fork arms.

Of course, the two marginal regions of a plate to be introduced into the longitudinal grooves of the fork arms must not be coated or printed on lest they stick in the plate carrier when drying and obstruct removal. Plates thus introduced into the plate carriers will of course be turned over with the carriers. However, it was difficult to fulfill the unavoidable condition that the free ends of the fork arms must be arrested accurately opposite the leading edge of the plate to be inserted into their grooves, and moreover, that the entire fork arms and the entire length of the plate are in perfect or at least near perfect alignment with each other, at least substantially in the same plane, as, otherwise, there is danger that the opposite rims of the plate will bind in the grooves of the fork arms and the only partially, e.g. by half, inserted plate will become stuck in the carrier.

This absolute requirement is difficult to meet in practice, as a different number of plates may be loaded on to a number of carriers in the ascending branch, if an elevated drying chamber is used relative to the plane of plate introduction. Consequently, due to a continuously varying load on the ascending and subsequently on the descending stretch, the conveyor chains will show different amounts of play. Of course, if a sunk drying chamber is used the load will be applied first to the descending and then to the ascending stretch.

Moreover, due to climatic or other influences, the fork arms may become warped in time relative to their closed end bars by means of which they are firmly attached to the conveying mechanism.

For this reason I have seen centering devices provided to engage the two fork arms of a carrier in the arrested position of the latter ready to be loaded. These devices comprised a pin projecting on each of the outside walls, turned away from each other, of the fork arms, in their middle regions between their fixed and their free ends, and, in an aligning device, an engaging centering member having a slot or groove therein with a flared entry opening at one end of the member facing forward or backward, relative to the location in which the fork arms bear their projecting pins . These two members of the aligning device provided firmly stationary in the framework, on the right-hand and left-hand outer sides of the respective two fork arms of the carrier, can be moved parallel with the direction in which the fork arms extend and can thereby catch the single pins on their respective sides firmly. However, I have found that the range within the flared slot opening of the centering member destined to catch a deviating pin on a badly aligned fork arm was not wide enough to catch the fork arm pin on one side, or the two fork arm pins on the outsides of the two fork arms. For it is not possible to enlarge the size of the pin-catching flared opening of a centering member at random as, otherwise, a pin of another fork arm, of a carrier above or below the one to be loaded, might be caught, as the distances between plate carriers in stacked arrangement in the ascending or descending stretches should be kept quite small, to increase the output rate of the apparatus.

Therefore, it would happen repeatedly that the earlier apparatus, the operation of which I had the occasion to supervise, suffered from the drawback that the centering member would hit with the frontal, vertical portion of its forward face, against the pin on the fork arm to be engaged, without the pin entering the outwardly flared recess which would have led it into correct position in the groove of the member. On the contrary, abutment of the vertical forward face of the centering member against the fork arm pin would cause bending of the fork arm and thus even greater misalignment and damage to the conveyor mechanism.

When the misalignment between the two fork arms of a carrier and the plate to be inserted thereinto was even greater, the pins on the two fork arms would miss the centering members completely and the advancing plate to be dried would come to lie on top or below of the carrier into whose fork arm grooves it should have been inserted.

The entire plate-conveying process would thus be seriously disturbed and interrupted. Plate carriers whose two fork arms have been distorted can cause jamming of the plate to be dried or cause excessive resistance to the complete introduction or withdrawal of the plate from its carrier. When the inner rearward regions of at least one of the fork arms of a carrier have become strongly deformed, it may happen that, even when the engagement of the centering pins in the centering members has been successful, the plate moving toward the carrier will miss the entrances to the fork arm grooves entirely.

A consequence of these effects is unavoidably an interruption of the operation of the entire apparatus, requiring exchange of strongly deformed carriers, and leading to damaged plates which have to be discarded as production waste.

As another problem I observed that the fact that plate carriers were exposed during operations to large fluctuations of temperature, e.g. in the case of conveyance of the plates through freezing, heating and burning stations, causes considerable changes in the dimensioning of the soldering or welding spots in the structure of the carrier leading in turn to deformation of the entire fork structure of the carrier.

OBJECTS AND SUMMARY OF THE INVENTION

It is a main object of the invention to provide an aligning and centering device for fork-shaped carriers at plate-loading and optionally at unloading stations, adapted for aligning the forward free fork arms of the carrier accurately with the plane in which plates are advanced for loading.

It is a further object of the invention to provide such aligning and centering advice in which the free fork ends are centered to register accurately with the leading edge of an advancing plate to insert the latter into longitudinal grooves provided in the inner walls of the fork arms, facing each other, to achieve an unobstructed, smooth insertion of the plate into the fork arm grooves, even when one or both of the fork arms are considerably warped or bent, by uneven loading in a conveying mechanism, or other reasons.

These objects are attained in an apparatus comprising
(a) a framework;
(b) a conveyor mechanism mounted in the framework for intermittent movement through a conveying path comprising at least one straight stretch, e.g., an ascending or descending one;
(c) a plate-loading station associated with a preferably straight stretch, and comprising plate-feeding means adapted for moving plates toward such stretch in a plate-advancement plane substantially normal to the conveying path;
(d) at least one fork-shaped carrier having transverse base means attached to the conveyor mechanism and two fork arms having rearward ends connected with the transverse base means to extend near the plate-advancement plane while passing through one of the stretches of the conveying path, and having free forward ends remote from the transverse base means, each of the two fork arms of the carrier having an inner longitudinal sidewall, facing toward the corresponding sidewall of the other fork arm, and a longitudinal groove extending from near the transverse base means forward to, and opening out of, the free fork end; and the carrier comprising cam means on the outside walls of each of the fork arms, and facing away from the other fork arm; and
(e) an aligning and centering device mounted stationary on the framework and comprising left-hand centering means located near one outside wall of a left-hand one of the fork arms and right-hand centering means near one outside wall of the other, right-hand fork arm, both centering means being displaceable in horizontal direction in parallel alignment with the plate-advancement plane into and out of engagement, respectively, with the cam means,
by the improvement of the alignment and centering device comprising
first engagement means adapted for engaging cams of the two fork arms of a carrier in a region of each of the fork arms extending from the middle thereof rearward to the transverse base means, thereby aligning at least this region of the fork arms accurately with the plate-advancement plane, and second centering means adapted for engaging cams of the same two fork arms in a region near the free ends of the two fork arms, thereby centering the free fork arm ends with sufficient accuracy relative to the plate-advancement plane for a complete, smooth introduction of a plate;with the longitudinal margins thereof into the longitudinal grooves in the two fork arms would be the preferred mode of introduction.

Preferably, each of the left-hand and right-hand centering means comprises a first centering member nearer the transverse base means and a second centering member nearer the free forward end of the same fork arm, and connecting means adapted for displacing the first and second centering members at a determined distance between their forward ends, and the outside wall of each of the fork means bears a first engaging cam located nearer the transverse means, and a second engaging cam located nearer the free fork arm end at a distance from the first engaging cam being greater than the distance between the forward ends of the first and second centering members from each other, and each of the centering members having on the side thereof, facing toward the nearest fork arm outside wall, groove means for receiving therein, respectively, the first and second engaging cams, these groove means having forwardly widening openings in the forward ends of the centering members, whereby the first occurring engagement of the first engaging cam by the first centering member causes accurate alignment of the region of the respective fork arm, from the middle thereof rearward toward the transverse base means of the carrier, with the plate-advancement plane, and subsequent engagement of the second engaging cam, via the widening groove opening into the groove means in the second centering member, centers the free fork arm end with sufficient accuracy in relation with the plate-advancement plane so as to achieve a smooth introduction of the longitudinal margins of the respective plate into the longitudinal grooves in the two fork arms of the respective carrier.

The distance between the first engaging cams and the transverse base means is larger than the length of the first centering member, taken in longitudinal direction parallel with the plate advancement plane.

When the centering means are in rearward end position, the first centering member is located near the outside wall of the respective fork arm with which the centering means are associated, in the interspace between the transverse base means and the first engaging cam on the outside wall, the distance between the first and second engaging cams is preferably such that, upon forward movement of the centering means, the first centering member engages the first engaging cam in the groove means of the centering member, rearward of the widening groove opening thereof, before the second centering member engages completely the second engaging cam.

Preferably, the groove means in the first centering member extends by such length in rearward direction that the first centering cam still remains accurately centered in the groove means of the first centering member, when the second centering cam has become fully centered in the groove means of the second centering member, at least one of the grooves of the first and second centering members having rearwardly located stop means therein.

The two centering organs, borne in fixed position on a horizontally displaceable actuating bar, can project from the same transversely to the horizontal plane defined by the groove means of the two pairs of first and second centering members of the aligning and centering device.

The entire aligning and centering procedure is thus subdivided in two phases when operating the apparatus improvement according to the invention: a preliminary alignment and, thereafter, a final alignment and centering of the free fork ends of a carrier accurately relative to the plane in which a plate being loaded into the carrier is introduced smoothly, free from any binding, with its two free longitudinal margins into the longitudinal grooves of the two fork arms of the carrier.

BRIEF DESCRIPTION OF THE DRAWINGS

Further objects and advantages of the invention will become apparent from the following more detailed description thereof in connection with the accompanying drawings in which

FIG. 2 shows in top view a forked plate carrier equipped with a preferred embodiment of the aligning and centering device according to the invention, in starting position;

FIG. 2A shows in lateral view the same parts as in FIG. 2, in the direction, and partially in longitudinal section, along the arrows and planes indicated by IIA—IIA in FIG. 2;

FIG. 3 shows in top view the same parts as in FIG. 2 but in an intermediate position of alignment;

FIG. 7 is a frontal view of a forward centering member of the aligning and centering device shown in FIG. 4, taken in the direction indicated by the arrows VII—VII in FIG. 4.

Figures 1, 1A:
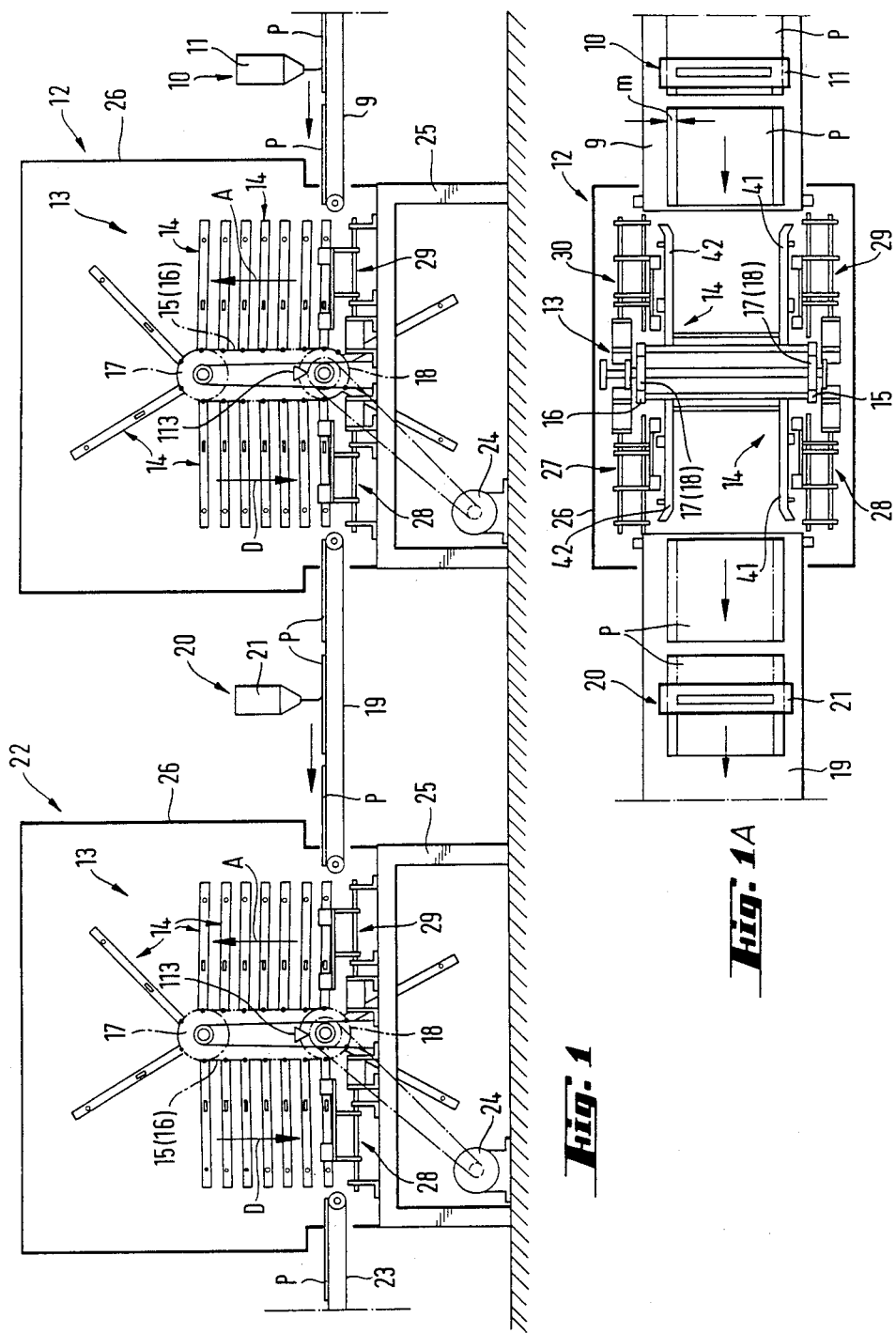
FIG. 1 is a schematical representation in lateral view of a plant comprising two coating or printing stations and two drying stations equipped with aligning and centering devices according to the invention.
FIG. 1A is a schematical top view on a section of the same plant, comprising a drying station thereof.

Fork arms are designated as being left-hand and right-hand ones, looking from the rearward transverse base member of a carrier toward the free fork ends.

DETAILED DESCRIPTION OF THE EMBODIMENT SHOWN IN THE DRAWINGS

In FIG. 1 there is shown schematically a plates- or boards-processing plant which comprises a first coating station 10 in which the top faces of plates being transported on a conveyor belt 9 are coated with the aid of a conventional pouring head 11. The coated plates P are conveyed to a first drying station 12 in which a conveyor mechanism 13 equipped with plate-holding carriers 14 receives plates P, having their top face coated, from the coating station 10.

It will be noted from FIG. 1A that the longitudinal margins m of the plates P remain uncoated. Coatings may, of course, be continuous or discontinuous as, for instance, in the case of a print. The print may be alphanumerical or represent the conductive lines of an electronic circuit or have any other desired configuration and purpose.

The conveyor mechanism 13 which comprises two conveyor chains 15 and 16 guided about sprockets 17 and 18 at the top and bottom of the conveying path, carries the plates P which are safely held in position in their carriers 14, upward through an ascending stretch A of the conveying path, then turns the plates over at the top end of the path and carries them, with their former underside now the top face, downward through a descending stretch D, at the foot end of which the plates P are withdrawn from, or pushed out of, the plate-carrriers 14 by means known per se (not shown) on to a conveyor belt 19 with their dried initial top face as the underside and the still uncoated face as the top face.

Thereupon, the conveyor belt 19 passes the plates through a second coating or printing station 20 where the top face of the plates P are now coated or printed with the aid of another pouring head 21, and then pass into a second drying station 22 having the same kind of conveying equipment as the drying station 10.

Finally, the plates or boards, coated or printed on both of their large faces, are discharged from the plant on to another conveyor belt 23 that will carry the dry plates to yet another station of the plant.

Each drying station comprises a motor drive 24, a framework 25, a housing 26, and aligning and centering devices 27 to 30.

In order to load and unload plates P from the conveyor mechanism 13, the conveyor chains 15,16 must be stopped for a short interval and then continue moving along their conveying path. Their intermittent movement is controlled by an electronic control unit of which only a sensor, e.g. a photoelectric cell 113 is shown.

The aligning and centering devices 27 and 28 may be omitted whenever the transfer of the plates dried on one or both sides, on to the conveyor belt 19 or 23, respectively, can be effected conveniently by having the carriers 14 from which the plates are to be discharged at the foot end of the descending stretch D, stop for the discharging interval at a level slightly above that of the conveyor belt 19 or 23.

However, for the reasons stated hereinbefore, it may be advantageous to provide aligning and centering devices not only at the foot of the ascending stretch A but also at the descending stretch D, at least in the drying station 12.

In FIGS. 2 through 4A, there is shown a fork-shaped plate-holding carrier 14 with a left-hand aligning and centering device 30 mounted on the framework 25 to the left of a left-hand carrier fork arm 42 of the carrier 14 and a right-hand aligning and centering device 29 to the right of the right-hand carrier form arm 41 (looking toward the open fork end).

The two fork arms 41 and 42 are mounted rigidly in a common transverse base 40 which is in turn firmly connected to chain links 15a and 16a, aligned with one another, of the conveyor chains 15 and 16, respectively, and will extend substantially horizontally while the chain links to which they are attached pass through the ascending or descending stretch A,D of their conveying path.

Figure 4:
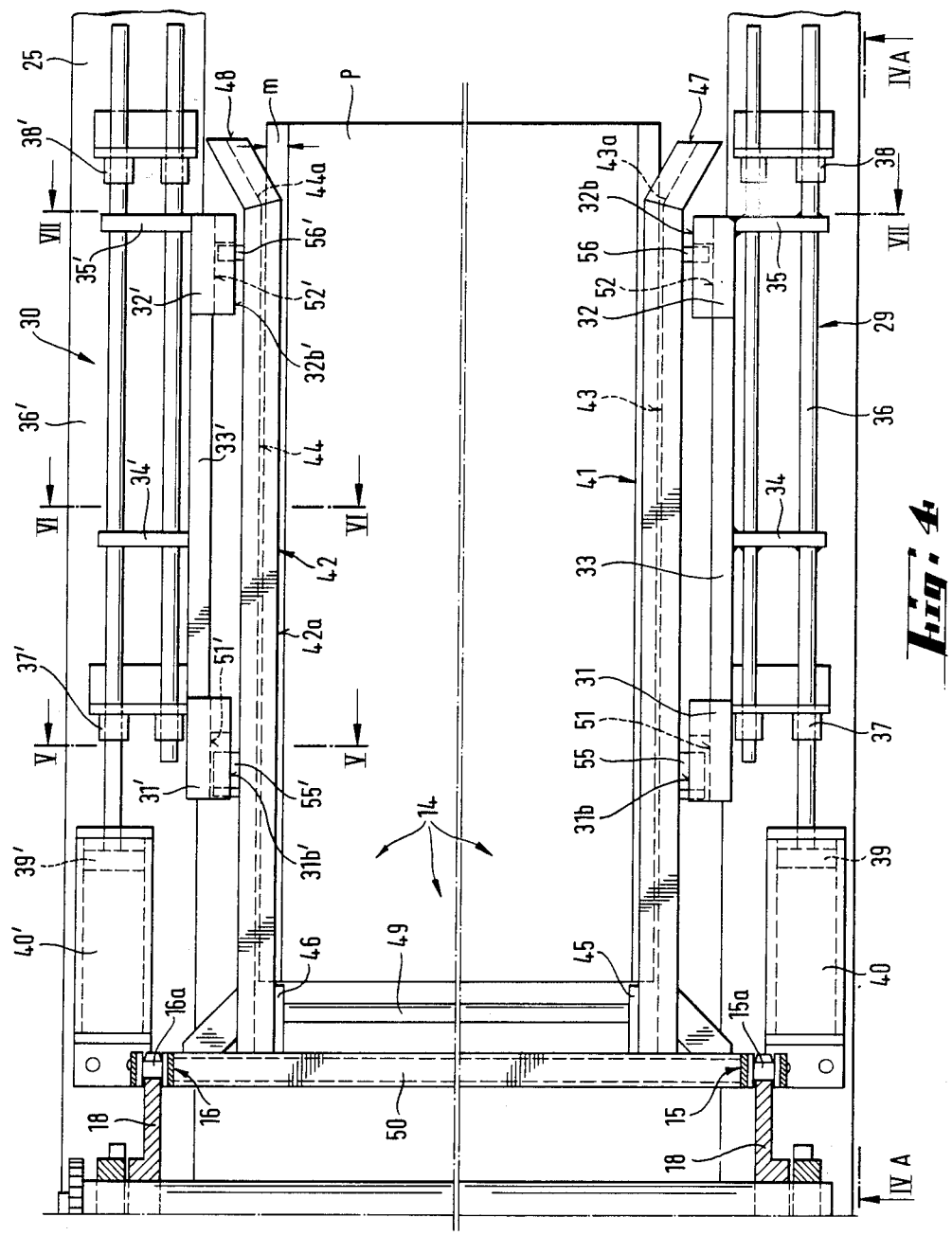
FIG. 4 shows in top view the same parts as in FIGS. 2 and 3, but in the final position in which a plate has been loaded into the fully aligned and centered fork arms of a carrier.
Figure 6:
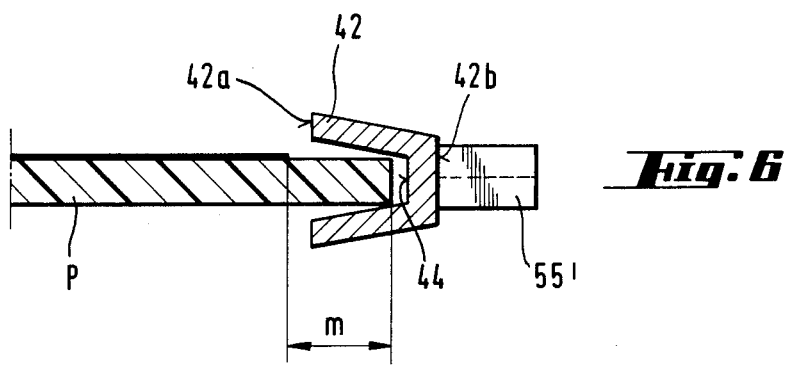
FIG. 6 is a partially cross-sectional view of the left-hand fork arm shown in FIG. 4, and adjoining parts, taken along a plane indicated by VI—VI in FIG. 4.

On the inner sidewalls 41a and 42a of the fork arms 41 and 42, there are provided longitudinal grooves 43 and 44 (see also FIG. 6) adapted for receiving the uncoated margins m of a plate P, e.g. an electronic circuit board, therein (FIG. 4).

At the rearward ends of the fork arms 41 and 42, where they are joined to the transverse base 40, stop plates 45,46 are provided on the inner fork arm sidewalls 41a and 42a to stop a plate P being introduced into grooves 43,44 from penetrating further into the carrier 14.

The free ends 47 and 48 of the fork arms 41 and 42 are flared outwardly in forward direction, and the longitudinal fork arm grooves have forward openings 43a and 44a at these free fork arm ends.

A cross bar 49 is mounted between the stop plates to stabilize the positioning of the fork arms 41 and 42. Moreover, if the stop plates are placed slidably forward in the grooves 43 and 44, a pushing device (not shown) can engage the cross bar 49 and serve to expel a dried plate P by moving the stop plates 45 and 46 forward and then withdraw them again rearward into their starting position.

The construction of the aligning and centering mechanisms 27 to 30 shall now be explained as shown in particular in FIGS. 2 and 2A. The device 30 comprises the same parts, but in mirror symmetrical arrangement, the reference numerals for like parts are the same, but primed symbols in the case of the device 30.

Figure 4A:
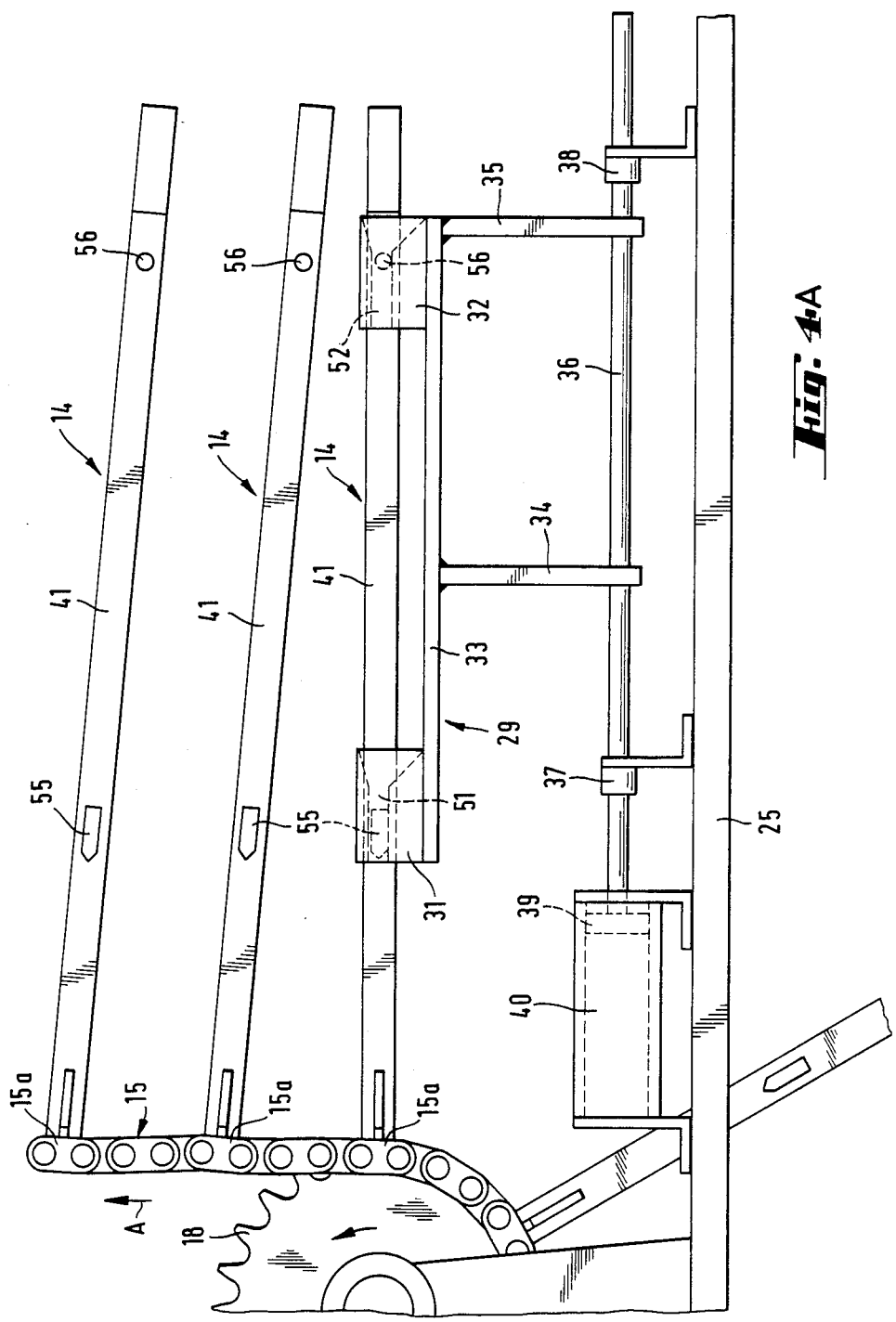
FIG. 4A shows in lateral view the same parts as in FIGS. 2A and 3A, but in the positions shown in FIG. 4, taken in the direction indicated by the arrows IVA therein.

The aligning device 29 which is shown in detail in particular in FIGS. 2A and 4A, comprises a rearward centering member 31 and a forward centering member 32 which are both borne in fixed position on the rearward and forward end, respectively, of a rigid connecting bar 33. The latter is connected via connecting rods 34 and 35 with the piston rod 36, safely guided in bearings 37 and 38, which is connected with a pneumatically or hydraulically operated piston 39 housed in a cylinder 40.

The cylinder 40 and the piston rod bearings 37 and 38 are mounted fixedly on the framework 25.

Preferably, the centering members 31 and 32 are mounted on top of the connecting bar 33, but they can, of course, be arranged on the bar in a different manner, or be connected with each other by other mechanical means but always with their forward ends at a determined distance $d_1$ from each other.

Each of the centering members 31 and 32 is provided, in the sidewall 31b,32b thereof facing toward the adjacent fork arm 42, with a centering groove 51,52 which has a forwardly widening groove mouth 53,54, respectively, which opens out of the forward ends 31a,32a of the respective member.

The centering grooves 51 and 52 are adapted for engaging projections or pins 55 and 56 which are fixedly mounted on the outside wall 42b of the adjacent fork arm 42, at a distance $d_2$ between their rearward ends 55a and 56a which is somewhat larger than the distance $d_1$ between the frontal ends 31a and 31b of the centering members 31 and 32.

Preferably, the rearward engaging pin 55 has the shape of an elongated lug while the forward pin 56 is a round peg.

Figure 3A:
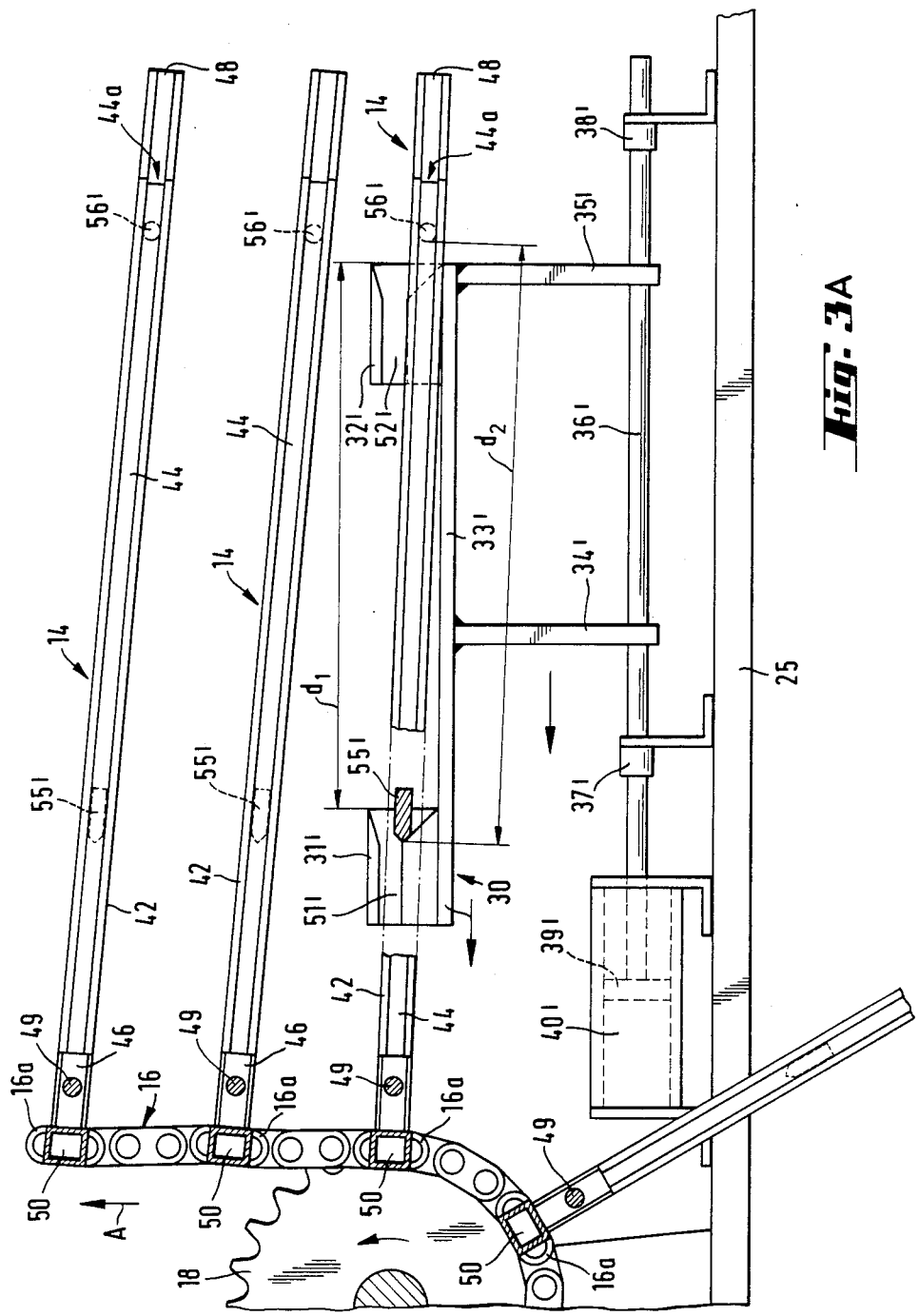
FIG. 3A shows in lateral view the same parts as in FIG. 2A, but in the same positions as shown in FIG. 3, taken in the direction, partially in sectional view, indicated by arrows IIIA and planes IIIA—IIIA in FIG. 3.

In FIG. 3 and particularly in FIG. 3A, the corresponding parts of the aligning device 30 are shown and those corresponding to the parts described above bear the same reference numerals but as "primed" symbols.

When an empty carrier 14 arrives, for instance from below the level of the plane in which the plates P are advanced by the conveyor belt 9 toward the conveyor mechanism 13, and stops, due to the intermittent movement of the latter, at that level, the piston 39 of the aligning and centering device 29 is in its rearward end position in the cylinder 40 and, consequently, the centering members 31 and 32 are in their rearward end positions. The same is true for the piston 39' in the cylinder 40' and the centering members 31' and 32' pertaining to the aligning and centering device 30.

The engaging pins 53 and 54 on the outside wall 41b of the fork arm 41 and the corresponding engaging pins 55' and 56' on the outside wall 42b of the other fork arm 42 thus come to stop, respectively, forward of the forward ends 31a and 31b of the centering members 31 and 32 of the device 29, and forward of the forward ends 31a' and 32a' of the centering members 31' and 32' of the device 30.

As can be seen in FIG. 2A, the free end 47 of the fork arm 41 badly deviates from the horizontal position which it should adopt and the same shall be true for the other fork arm 42; the latter may deviate more or less strongly from the horizontal plane, i.e., the carrier 14 can be rather badly warped.

The aligning and centering devices 29 and 30 are now put in operation and pistons 39 and 39' will move forward and cause connecting bars 33 and 33' as well as the centering members 31,31' and 32,32' to move forward correspondingly. An intermediate stage of this forward movement of the aligning and centering parts is illustrated in FIGS. 3 and 3A.

At this stage, the rearward centering members 31 and 31' have engaged the rearward engaging pins 55 and 55', which have slid up the lower tapered walls of the groove mouths 53 and 53' into the narrow aligning grooves 51 and 51' of the members 31 and 31', respectively. Thereby, they have raised the middle regions of the fork arms 41 and 42, respectively to a position parallel with the plate-advancement plane on the conveyor belt 9.

Moreover, the free ends 47 and 48 of the fork arms 41 and 42, respectively, have been raised sufficiently so that the engaging pins 56 and 56' in the forward arm regions are now at a level such that upon further forward movement of the aligning and centering devices 29 and 30, these forward pins 56 and 56' can now become engaged by the groove mouths 54 and 54' of the forward centering members 32 and 32'.

At the stage shown in FIGS. 3 and 3A this is not yet the case.

It will also be understood from, in particular, FIG. 2A that, had there been a single engaging pin, e.g. in a middle region forward of the centering member 31, such pin might have missed the groove mouth 53 of that member, passing below it or hitting frontally against the lower edge of the groove mouth 53 at the forward end 31a of the centering member 31.

But even if the centering member 31 had caught such engaging pin in the middle region of the fork arm 41, and would have raised that arm accordingly, this would not have sufficed in the case of a badly misaligned fork arm as illustrated in FIG. 2A, to raise the forward end 47 of the fork arm 41 and, of course, correspondingly the forward end 48 of the fork arm 42, sufficiently for the advancing leading plate edge to enter the fork arm grooves 43 and 44 of the two fork arms 41 and 42. Instead, the plate P may well slide upward on top of the fork arms 41 and 42.

Yet even if the fork ends 47 and 48 had been raised by such known engaging pins in the middle regions only, of the fork arms 41 and 42, and if the leading edge of a plate P had succeeded in entering the forward open ends of the fork arm grooves 43 and 44, the added weight of the plate P might have bent the unsupported forward regions of the fork arms 41 and 42 slightly downwardly and cause binding of the advancing leading plate portion touching at the top and bottom walls of the longitudinal grooves 43 and 44, thus interrupting the loading phase.

This is completely avoided by the aligning and centering devices 29 and 30 once their centering members 31,32 and 31', 32' have been advanced by the pistons 39 and 39' to their forward end positions illustrated in FIGS. 4 and 4A. In this end position, the forward pin 56 has slid upward on the upwardly and rearwardly slanted lower wall of the groove mouth 54 and has entered the narrow groove 52 in the forward centering member 32 cooperating with the fork arm 41, and the same will have happened with pin 56', having entered the narrow groove 52' of the forward centering member 32' cooperating with the other fork arm 42.

This means that the forward open ends of the longitudinal fork arm grooves 43 and 44 are now centered accurately with regard to the leading edge of the plate P, and as the latter enters with its uncoated right-hand and left-hand margins m into these grooves, the forward regions of the fork arms 41 and 42 will be adequately supported by the forward connecting rods 35 and 35' resting in their bearings 38 and 38 so that the added weight of plate P, as it slides smoothly into place between the fork arms 41 and 42 in the carrier 14, will not be able to cause any deformation of the fork arms.

While in all of FIGS. 1 to 4A the cylinders 40 and 40' have been shown to one side of the centering members 31, 31',32,32' and the connecting bars 33,33', they can actually be located below them as shown for better support.

Figure 5:
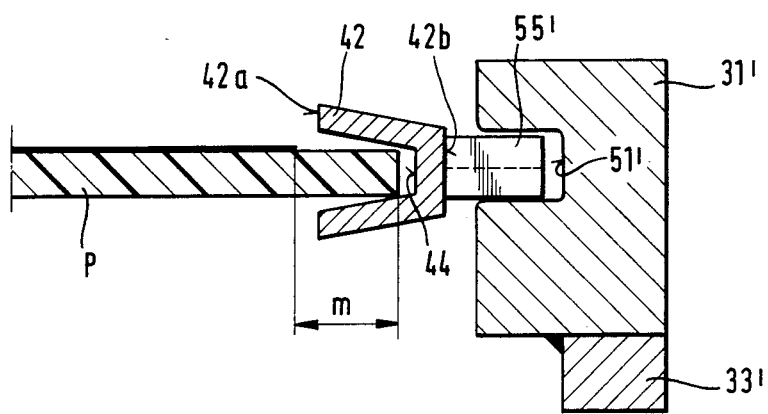
FIG. 5 is a cross-sectional view of a rearward centering member of the aligning and centering device in the same embodiment, taken in a plane indicated by V—V in FIG. 4.

In FIGS. 5 and 7 there are shown the centering members 31' and 32', the former in sectional and the latter in frontal view. From FIG. 7 it will be seen that the narrow groove 52' in the forward centering member 32' is preferably provided in the upper half of the member, so that the widening groove mouth 54' has a smaller, flatter slanted top wall 54a' and a larger slanted lower wall 54b'. This facilitates catching of the pin 56' which will be at a lower level than the groove 52' due to the bending of the forward region of the fork arm 42.

The same configuration of the narrow groove 52 and the forwardly widening groove mouth 54 is, of course, provided in the corresponding forward centering member 32 engaging the pin 56 on the fork arm 41. But this configuration is also advantageously given to the same passages in the rearward centering members 31 and 31', respectively.

In the above-described embodiment illustrated in FIGS. 1 to 7, the alignment of the carrier fork arms and centering of the free fork arm ends with a plate-advancement plane is carried out with regard to such a plane which extends horizontally. Of course, the same aligning and centering device could also be associated with fork-arms which are to be aligned and centered with regard to an inclined or vertical plate-advancement plane, adding, where necessary, conventional structural elements to offset the effects of gravity vectors which differ from those of a horizontal arrangement in a known manner.

The aligning and centering devices according to the invention satisfactorily overcome the initially mentioned drawbacks of forked carriers in which the plates to be carried are inserted in two parallel fork arm grooves. Thus the opening angle of the widening groove mouth 53,53' of the first, rearward centering member can be easily made wide enough to catch a rearward fork arm cam 55,55' even if the deviation of the respective fork arm (41 or 42) from the horizontal plane is quite considerable. The alignment imparted to the fork arm by this first, rearward centering arrangement will raise the forward region of the fork arm sufficiently to bring the forward cam 56,56' within the catching range of the widened groove mouth 54,54' of the forward centering member 32,32'.

Even a carrier whose two fork arms are strongly warped not only with regard to the horizontal plane but also relative to each other are readily aligned and centered by above-described devices 27 to 30 according to the invention to guarantee a smooth loading and, if required, an equally smooth unloading of plates (in the widest sense) into and out of a conveying mechanism comprising carriers with grooved fork arms of the type described.

Of course, the aligning and centering devices of the invention need not be disposed to the right and to the left, respectively, of the right-hand and left-hand fork arms of a carrier, but they can also be arranged above or below these fork arms, with the engaging cam means or the like of the fork arms being mounted on the top surface or the underside of these arms, i.e. on one of the outside walls of each fork arm, preferably identically located ones on both arms.

While these devices have been illustrated in FIGS. 1 to 7 as requiring a rearward aligning arrangement and a forward centering arrangement comprising centering members mechanically held in parallel relationship to the plate-advancement plane at a determined distance thereto and engaging cam means provided on the fork arms of a carrier and cooperating with the centering members, these arrangements can also be embodied by different means; for instance the cam means on the fork arms can be replaced by other types of engaging means, e.g., the centering members whose grooves would then be open away from the fork arm toward the outside, and the centering members could be designed as cams to be engaged by the centering members on the fork arms. Moreover "centering members" and fork arm "cams" can be other, e.g. electromagnetical means executing the same functions. Likewise, instead of being arranged on a common connecting bar, the rearward and forward centering member can be arranged separately displaceably on the framework and can function in the same manner as described by having electromagnetic driving means effecting their displacement to engage corresponding engagement means on the two fork arms and being controlled electronically, in lieu of effecting such displacement by hydraulic or pneumatic means as described.

I claim:

1. In an apparatus comprising
   (a) a framework;
   (b) a conveyor mechanism mounted in said framework for intermittent movement through a conveying path comprising at least one straight stretch;
   (c) a plate-loading station associated with one such stretch and comprising plate-feeding means adapted for advancing a plate toward, and in a plate-advancement plane substantially normal to, the conveying path in said one stretch;
   (d) at least one fork-shaped carrier comprising transverse base means attached to said conveyor mechanism and two fork arms having rearward ends connected with said transverse base means, and extending near said plate-advancement plane at an interval between moving through said one stretch, said fork arms having free forward ends remote from said transverse base means, and said carrier comprising further engaging means on an outside wall of each of said fork arms and facing away from the other fork arm; and
   (e) an aligning and centering device mounted stationary on said framework and comprising two aligning means located, one near said outside wall of one of said fork arms, and the other near said outside wall of the other fork arm, both aligning means being displaceable in parallel relation to said plate-advancement plane into and out of engagement, respectively, with said engaging means of said fork arms,
   the improvement of said aligning and centering device comprising
   (i) first aligning means adapted for engaging said engaging means of said two fork arms of said carrier, in a region of each of said fork arms extending from the middle thereof rearward to said transverse base means, thereby aligning at least the said region of the fork arms accurately with the plate-advancoement plane, and
   (ii) second aligning means adapted for engaging said two fork arms in a region near the free fork arm ends while said first aligning means maintain their engagement with engaging means in said region from the middle thereof rearward, thereby centering said free fork arm ends with sufficient accuracy relative to the plate-advancement plane for a smooth complete loading of a plate in said carrier.

2. The improvement of claim 1, wherein each of said two fork arms has a longitudinal groove in an inside sidewall of said fork arm facing toward the other fork arm, and said fork arms are adapted for receiving a plate with opposite longitudinal plate rims in the said grooves.

3. The improvement of claim 1, wherein each of said engaging means of said fork arms comprises first cam means in said region of each fork arm extending from the middle thereof rearwardly, and second cam means located near the free fork arm end, said first aligning means comprises a first centering member adapted for engaging said first cam means, and said second aligning means comprises a second centering member adapted for engaging said second cam means.

4. The improvement of claim 3, wherein said aligning and centering device further comprises connecting means associated with said first and second aligning means and adapted for displacing said first and second centering member keeping a determined distance between their forward ends, said first centering member being displaced simultaneously with said second centering member.

5. The improvement of claim 4, wherein said first and said second cam means have rearward ends at a distance from each other greater than said distance between said forward ends of said first and second centering members.

6. The improvement of claim 5, wherein each of said centering members has a sidewall surface facing toward an outside wall of the nearest fork arm bearing the cam member to be engaged by said centering member, and groove means in said centering member sidewall surface having a forwardly widening opening in the forward end of said centering member.

7. The improvement of claim 5, wherein the distance of said first cam means from said transverse base means is larger than the length of said first centering member in a direction parallel with said plate-advancement plane.

8. The improvement of claim 7, wherein said first centering member is located, in a starting position, near the outside wall of a fork arm in the interspace between the transverse base means, connected therewith, and the rearward cam means thereon, and the distance between said rearward and said forward cam means thereon, taken at the rearward ends of said cam means, is so much greater than the distance between the forward ends of said first and second aligning means that, upon simultaneous forward movement of said first and second aligning means, said rearward cam means will be engaged by said first aligning means before said forward cam means are engaged by said second aligning means so that both aligning means maintain said first and second cam means engaged, thereby aligning the respective fork arm with the plate-advancement plane and centering the free fork end thereof with a plate to be loaded into the respective carrier.

9. The improvement of claim 6, wherein said connecting means is an actuating bar being displaceable in a direction parallel with said plate-advancement plane, and has a rearward and a forward end, and said first and second centering members are mounted on said actuating bar at the rearward and forward ends thereof, respectively, and extend transverse to said plane so as to have said groove means therein extend parallel with said plane.

10. The improvement of claim 3, wherein said aligning and centering device further comprises supporting means stationary on said framework and adapted for supporting said free fork end in centered position relative to said plate-advancement plane, when said second cam means is engaged by said second centering member, even when a load is added to said fork arm by said plate being advanced into said carrier.

11. An alignment and centering device adapted for association with a fork shaped carrier, having two fork arms having each a rearward end and a forward free end, which carrier comprises a transverse base means to which the rearward ends of said fork arms are attached and which is adapted for being connected with chain links of a conveyor mechanism in a framework associated with a plate-loading station and plate-feeding means at said station adapted for advancing plates toward said free fork ends of said fork-shaped carrier, when they arrive at said plate-loading station, in a plate-advancement plane, said alignment and centering device comprising
  (a) rearward and forward engaging means on each of said fork arms on an outer wall thereof facing away from the other fork arm,
  (b) a first aligning means adapted for engaging said rearward engaging means, and
  (c) forward, centering aligning means adapted for engaging said forward engaging means on said fork arm, after said rearward engaging means have been, and are still engaged by said first aligning means,
said alignment and centering device being stationary on said framework and said first and second aligning means being displaceable therein in a direction parallel with said plate-advancement plane.

* * * * *